US010410797B2

United States Patent
Chen et al.

(10) Patent No.: US 10,410,797 B2
(45) Date of Patent: Sep. 10, 2019

(54) METHOD OF FABRICATING SOLAR CELL

(71) Applicant: NATIONAL CHENG KUNG UNIVERSITY, Tainan (TW)

(72) Inventors: Chao-Yu Chen, Tainan (TW); Tzung-Fang Guo, Tainan (TW); Wei-Chih Lai, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 15/706,287

(22) Filed: Sep. 15, 2017

(65) Prior Publication Data
US 2018/0350529 A1 Dec. 6, 2018

(30) Foreign Application Priority Data
Jun. 5, 2017 (JP) .................................. 106118602 A

(51) Int. Cl.
*H01G 9/20* (2006.01)
*H01L 51/42* (2006.01)
*H01L 51/00* (2006.01)
*H01L 51/44* (2006.01)

(52) U.S. Cl.
CPC ....... *H01G 9/2022* (2013.01); *H01L 51/0003* (2013.01); *H01L 51/4213* (2013.01); *H01L 51/4273* (2013.01); *H01L 51/442* (2013.01)

(58) Field of Classification Search
CPC .................................................. H01G 9/2022
See application file for complete search history.

(56) References Cited

U.S. PATENT DOCUMENTS

| 8,754,323 | B2 | 6/2014 | Hayase et al. | |
|---|---|---|---|---|
| 2011/0132446 | A1* | 6/2011 | Lu | H01G 9/2036 136/255 |
| 2011/0146777 | A1 | 6/2011 | Zhao et al. | |
| 2011/0315225 | A1* | 12/2011 | Choi | B82Y 10/00 136/263 |
| 2012/0055549 | A1 | 3/2012 | Kohno et al. | |
| 2014/0251428 | A1* | 9/2014 | Lindstrom | H01G 9/2027 136/256 |

(Continued)

FOREIGN PATENT DOCUMENTS

| CN | 103490011 B | 8/2016 |
|---|---|---|
| EP | 2037529 A1 | 3/2009 |

(Continued)

*Primary Examiner* — Kyoung Lee
*Assistant Examiner* — Christina A Sylvia
(74) *Attorney, Agent, or Firm* — Muncy, Geissler, Olds & Lowe, P.C.

(57) ABSTRACT

A method for fabricating a solar cell is provided and has steps of: providing a transparent conductive substrate; forming a porous supporting layer on the transparent conductive substrate; forming a porous conductive counter electrode layer on the porous supporting layer, where the porous conductive counter electrode layer includes a carrier blocking layer and a conductive layer, and the carrier blocking layer is between the porous supporting layer and the conductive layer; and providing a light-absorbing material penetrating from the porous conductive counter electrode layer. The light-absorbing material fills within the porous supporting layer through a plurality of pores in the porous conductive counter electrode layer.

10 Claims, 2 Drawing Sheets

(56) References Cited

U.S. PATENT DOCUMENTS

| 2016/0005986 A1 | 1/2016 | Guo et al. |
| 2016/0111575 A1 | 4/2016 | Han et al. |
| 2016/0126019 A1 | 5/2016 | Lindstrom et al. |
| 2017/0162811 A1 | 6/2017 | Li et al. |

FOREIGN PATENT DOCUMENTS

| EP | 2237362 A1 | 10/2010 |
| EP | 2894708 A1 | 7/2015 |
| EP | 3279960 A1 | 2/2018 |
| TW | 201545186 A | 12/2015 |
| TW | 201603293 A | 1/2016 |
| WO | 2016005868 A1 | 1/2016 |

\* cited by examiner

METHOD OF FABRICATING SOLAR CELL

CROSS REFERENCE TO RELATED APPLICATION

This application claims priority to Taiwan Patent Application No. 106118602, filed on Jun. 5, 2017, which is incorporated herein by reference in its entirety.

FIELD OF THE DISCLOSURE

The present disclosure relates to a method of fabricating a battery, and more particularly to a method of fabricating a solar cell.

BACKGROUND OF THE DISCLOSURE

Solar cells have been developed over half century and are one of the main sources of energy for future alternatives to oil. There are many types of solar cell, such as single crystal silicon solar cells, polycrystalline silicon solar cells, thin film solar cells, organic solar cells, perovskite solar cells, dye sensitization solar cells, and others. Among these solar cells, novel photovoltaic components, such as the perovskite structural material solar cells, have advantages of high power conversion efficiency, low cost, and are easy to manufacture. Although perovskite solar cells using organic material as hole transport layer have excellent efficiency, the organic hole transport layer has a complicated synthesis process and easily reacts with water and oxygen, resulting in poor stability of the photovoltaic devices. In order to improve the stability of perovskite solar cells, inorganic selective contact materials have been developed for the perovskite solar cells.

Deposition of inorganic materials on perovskite layer has improved the device stability. However, there are some disadvantages that prevent its practical use. For example, organic-inorganic hybrid perovskite is susceptible to ion bombardment, and vulnerable to high temperature and polar solvent, causing perovskite decomposition. Further, deposition of inorganic materials usually require high temperature, vacuum sputtering, and other processes in order to form the thin film. Therefore, application of inorganic materials on top of perovskite solar cells is very limited.

However, in order to improve the stability of the perovskite solar cell and to reduce the production cost, a low-cost carbon material has been developed to use as a counter electrode for perovskite solar cell. In addition, due to porosity of counter electrode, light-absorbing materials can be filled in mesoporous scaffold from the top of porous carbon electrode. However, the conductivity of the carbon material is poor. Although a micro-thick porous carbon film can achieve the conductive demand, the main issue is that it is easy to peel off due to poor adhesion, so that it is not easy to maintain the integrity of device architecture when reusing it.

As a result, it is necessary to provide a method of fabricating a solar cell to solve the problems existing in the conventional technologies, as described above.

SUMMARY OF THE DISCLOSURE

A primary object of the present disclosure is to provide a method of fabricating a solar cell, which is to use a porous conductive counter electrode layer as a counter electrode so as to provide an excellent conductivity. Further, the porous conductive counter electrode layer has an excellent adhesion to provide robust device architecture when reusing it.

Another object of the present disclosure is to provide a method of fabricating a solar cell, where the fabricated solar cell has a porous conductive counter electrode layer including a carrier (electron or hole) blocking layer and a conductive layer. The carrier blocking layer can avoid a shunting path caused by the direct contact between the light absorbing material filled in the porous supporting layer and the conductive layer.

To achieve the above object, the present disclosure provides a method of fabricating a solar cell, including steps of: providing a transparent conductive substrate; forming a porous supporting layer on the transparent conductive substrate; forming a porous conductive counter electrode layer on the porous supporting layer, wherein the porous conductive counter electrode layer includes a carrier blocking layer and a conductive layer. The carrier blocking layer is deposited between the porous supporting layer and the conductive layer; and providing light-absorbing material to penetrate through the porous conductive counter electrode layer. The light-absorbing materials are filled into the porous supporting layer from the top of porous conductive counter electrode layer through a plurality of pores of porous conductive counter electrode layer.

In one embodiment of the present disclosure, the carrier blocking layer is selected from a group consisting of iron oxide, cobalt oxide, copper oxide, silver oxide, nickel oxide, titanium oxide, chromium oxide, tin oxide, magnesium oxide, zinc oxide, manganese oxide, molybdenum oxide, and aluminum oxide.

In one embodiment of the present disclosure, the conductive layer is selected from a group consisting of platinum, gold, copper, nickel, chromium, aluminum, and silver; or the conductive layer is a transparent conductive film selected from a group consisting of indium-doped zinc oxide and aluminum-doped zinc oxide; or the conductive layer is selected from a group consisting of titanium nitride and tantalum nitride.

In one embodiment of the present disclosure, the porous supporting layer is selected from a group consisting of titanium oxide, zinc oxide, tin oxide, nickel oxide, copper oxide, aluminum oxide, and zirconium oxide.

In one embodiment of the present disclosure, the step of forming the porous conductive counter electrode layer on the porous supporting layer further includes steps of: forming a first material layer on the porous supporting layer, wherein the first material layer is selected from a group consisting of iron, cobalt, copper, silver, nickel, titanium, chromium, tin, magnesium, zinc, manganese, molybdenum, and aluminum; forming a second material layer on the first material layer, wherein the second material layer is selected from a group consisting of platinum, gold, copper, nickel, chromium, aluminum, and silver; or the second material layer is a transparent conductive film selected from a group consisting of indium-doped zinc oxide, and aluminum-doped zinc oxide; or the second material layer is selected from a group consisting of titanium nitride and tantalum nitride; and performing a sintering process to oxidize the first material layer, wherein the sintering process has a sintering temperature ranging from 450 to 550° C. and a sintering time ranging from 25 to 50 minutes.

In one embodiment of the present disclosure, the method further includes steps of: coating polystyrene microspheres on the porous supporting layer prior to the step of forming the first material layer on the porous supporting layer, wherein the polystyrene microspheres occupy a portion of a volume of the first material layer and a portion of a volume of the second material layer.

In one embodiment of the present disclosure, the method further includes steps of: removing the polystyrene microspheres after the step of forming of the porous conductive counter electrode layer.

In one embodiment of the present disclosure, the step of forming the porous conductive counter electrode layer on the porous supporting layer further includes steps of: forming a first material layer on the porous supporting layer, wherein the first material layer is selected from a group consisting of iron, cobalt, copper, silver, nickel, titanium, chromium, tin, magnesium, zinc, manganese, molybdenum, and aluminum; forming a second material layer on the first material layer, wherein the second material layer is selected from a group consisting of platinum, gold, copper, nickel, chromium, aluminum, and silver; or the second material layer is a transparent conductive film selected from a group consisting of indium-doped zinc oxide and aluminum-doped zinc oxide; or the second material layer is selected from a group consisting of titanium nitride and tantalum nitride; and performing a lithography and etching process on the first material layer and the second material layer such that the first material layer and the second material layer has a porous structure; and performing a sintering process on the first material layer with the porous structure and the second material layer with the porous structure to oxidize the first material layer, wherein the sintering process has a sintering temperature ranging from 250 to 350° C. and a sintering time ranging from 25 to 35 minutes.

In one embodiment of the present disclosure, the step of forming the porous conductive counter electrode layer on the porous supporting layer further includes steps of: coating composite metal microspheres on the porous supporting layer, wherein the composite metal microspheres has a core-shell structure comprising a core and a shell surrounding the core, wherein the core is selected from a group consisting of platinum, gold, copper, nickel, chromium, aluminum and silver; or the core is a transparent conductive material selected from a group consisting of indium-doped zinc oxide and aluminum-doped zinc oxide; or the core is selected from a group consisting of titanium nitride and tantalum nitride; and wherein the shell is selected from a group consisting of iron, cobalt, copper, silver, nickel, titanium, chromium, tin, magnesium, zinc, manganese, molybdenum, and aluminum; and performing a sintering process on the composite metal microspheres to oxidize the shells of the composite metal microspheres, and thus the oxidized shell and the core become the carrier blocking layer and the conductive layer of the porous conductive counter electrode layer, respectively, wherein the sintering process has a sintering temperature ranging from 250 to 550° C. and a sintering time ranging from 25 to 95 minutes.

In one embodiment of the present disclosure, the light-absorbing material is selected from a group consisting of a perovskite structure material, semiconductor compounds, and photosensitive dyes.

In one embodiment of the present disclosure, in the step of forming the porous conductive counter electrode layer on the porous supporting layer, the porous conductive counter electrode layer further includes another carrier blocking layer, wherein the conductive layer is disposed between the carrier blocking layer and the another carrier blocking layer.

DETAILED DESCRIPTION OF THE PREFERRED EMBODIMENTS

The structure and the technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
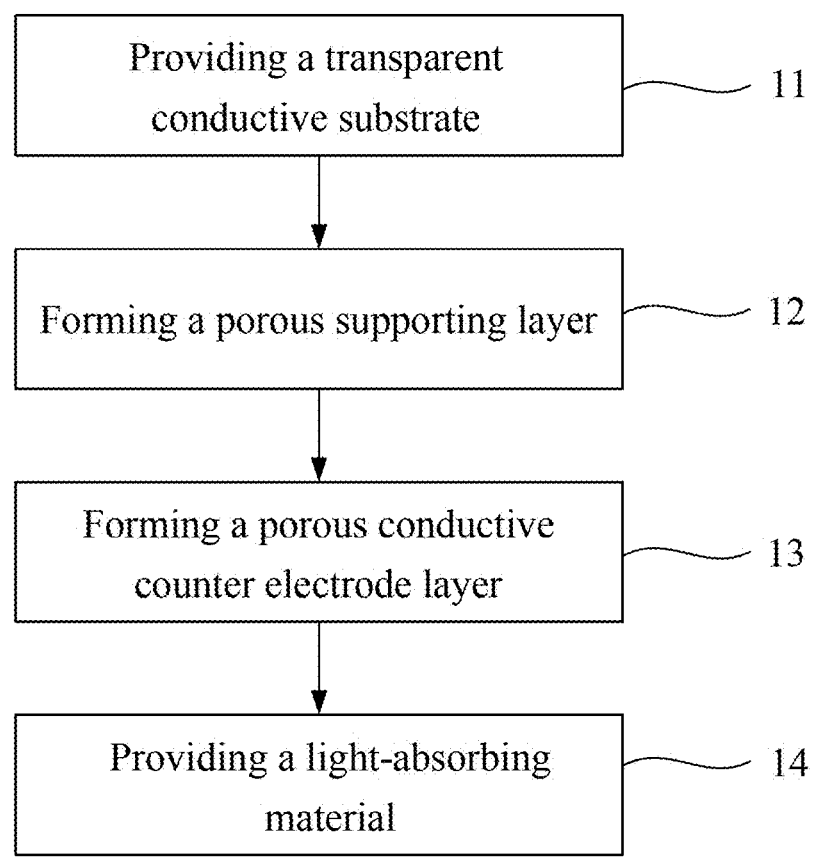
FIG. 1 is a flowchart of a method of fabricating a solar cell according to one embodiment of the present disclosure.

Please refer to FIG. 1, which is a flowchart of a method 10 of fabricating a solar cell according to one embodiment of the present disclosure. The method 10 of fabricating a solar cell mainly includes following steps 11 to 14, as follows: a transparent conductive substrate coated with selective contact is provided (step 11); a porous supporting layer is formed on the transparent conductive substrate (step 12); a porous conductive counter electrode layer is formed on the porous supporting layer, wherein the porous conductive counter electrode layer includes a carrier blocking layer and a conductive layer, and the carrier blocking layer is disposed between the porous supporting layer and the conductive layer (step 13); and a light-absorbing material is provided on the porous conductive counter electrode layer wherein the light-absorbing material fills within the porous supporting layer through the pores of the porous conductive counter electrode layer (step 14). The implementation details of the above-described steps and the principles thereof will be described in detail below.

The method 10 of fabricating the solar cell of one embodiment of the present disclosure has step 11: a transparent conductive substrate coated with selective contact is provided. In step 11, the transparent conductive substrate can be an indium tin oxide (ITO) transparent glass, such as an ITO transparent conductive film having a thickness ranging from 20 to 400 nm. In one embodiment, the transparent conductive substrate can be a fluorine-doped tin oxide (FTO) transparent conductive glass.

Then, the method 10 of fabricating the solar cell of one embodiment of the present disclosure has step 12: a porous supporting layer is formed on the transparent conductive substrate. In step 12, the porous supporting layer may be one or more mesoporous metal-oxide layers, for example, the porous supporting layer may be selected from a group consisting of titanium oxide, zinc oxide, tin oxide, nickel oxide, copper oxide, aluminum oxide, and zirconium oxide. A thickness of the porous supporting layer is, for example, between 40 and 10000 nm. In one example, the porous supporting layer can be a two-layer structure, such as a first porous supporting layer and a second porous supporting layer sequentially formed on the transparent conductive substrate. In one embodiment, the first porous supporting layer can be selected from a group consisting of semiconducting oxide such as titanium oxide, nickel oxide, and copper oxide, and thickness of the first porous supporting layer is, for example, between 30 and 5000 nm. In another embodiment, the second porous supporting layer can be selected from wide band gap insulating oxide such as aluminum oxide and zirconium oxide, and a thickness of the second porous supporting layer is, for example, between 10 and 5000 nm.

In one embodiment, the first porous supporting layer may be coated on the transparent conductive substrate by, for example, a method in which titanium oxide is spin-coated (for example, a rotational speed of 4000 RPM and a coating time of 30 seconds) and sequentially held at 125° C. for 5 minutes, at 225° C. for 5 minutes, at 325° C. for 5 minutes, and at 550° C. for 30 minutes, so as to form the first porous supporting layer.

In one embodiment, the second supporting layer may be coated on the first porous supporting layer by, for example, a method in which a aluminum oxide is spin-coated (for example, a rotational speed of 4000 RPM and a coating time of 30 seconds) and sequentially held at 125° C. for 5 minutes, at 225° C. for 5 minutes, at 325° C. for 5 minutes, and at 550° C. for 30 minutes, so as to form the second porous supporting layer.

In one embodiment, a dense selective contact layer may be formed between the porous supporting layer and the transparent conductive substrate, and the dense layer may be, for example, a titanium oxide thin film. In a specific example, a cleaned transparent conductive substrate is preheated between 450 and 500° C. (e.g., 475° C.). A titanium precursor (such as titanium diisopropoxide bis(acetylacetonate)) is diluted in anhydrous alcohol at a volume ratio of 1:39 (the titanium precursor: the anhydrous alcohol), and then sprayed uniformly on the transparent conductive substrate by a spray pyrolysis method (using an oxygen gas as a carrier gas). Finally, the substrate is held at a temperature between 450 and 500° C. (e.g., 475° C.) for 20 to 40 minutes (e.g., 30 minutes) to form the dense layer.

Then, the method 10 of fabricating the solar cell of one embodiment of the present disclosure has step 13: a porous conductive counter electrode layer is formed on the porous supporting layer, wherein the porous conductive counter electrode layer includes a carrier blocking layer and a conductive layer, and the carrier blocking layer is disposed between the porous supporting layer and the conductive layer. In step 13, the carrier blocking layer is, for example, selected from a group consisting of iron oxide, cobalt oxide, copper oxide, silver oxide, nickel oxide, titanium oxide, chromium oxide, tin oxide, magnesium oxide, zinc oxide, manganese oxide, molybdenum oxide, and aluminum oxide. A thickness of the carrier blocking layer is, for example, between 5 and 1000 nm (e.g., 10 nm, 50 nm, 100 nm, 200 nm, 500 nm, 700 nm, 900 nm, or 950 nm). In one embodiment, the conductive layer is selected from a group consisting of platinum, gold, copper, nickel, chromium, aluminum, and silver. A thickness of the conductive layer is, for example, between 5 and 1000 nm (e.g., 10 nm, 50 nm, 100 nm, 200 nm, 500 nm, 700 nm, 900 nm, or 950 nm). It is noted that the carrier blocking layer is mainly used to avoid a shunting path caused by direct contact between the light absorbing material filled in the porous supporting layer and the conductive layer. The porous conductive counter electrode layer may be formed in a variety of ways, as described below.

Figure 2A:
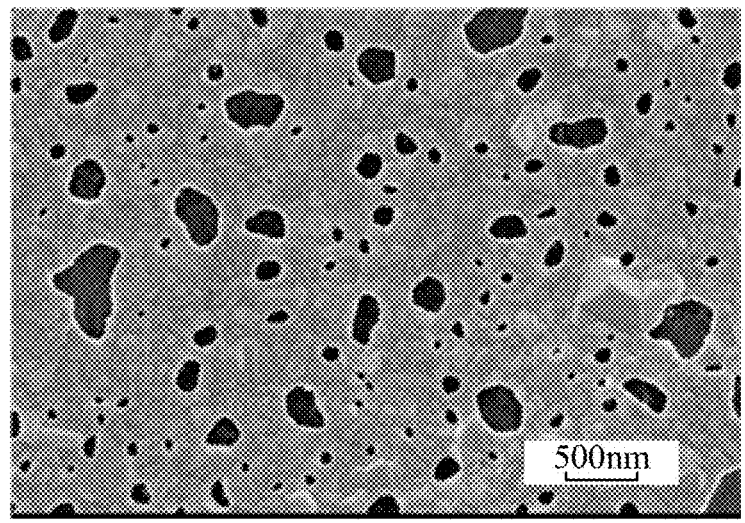
FIG. 2A is a microscopic schematic diagram of a porous conductive counter electrode layer formed by performing a sintering process at a sintering temperature of 500° C. for 30 minutes.
Figure 2B:
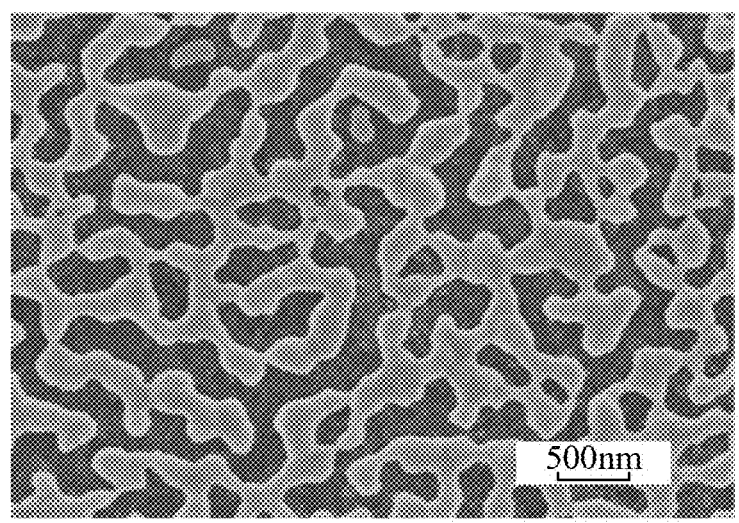
FIG. 2B is a microscopic schematic diagram of a porous conductive counter electrode layer formed by performing a sintering process at a sintering temperature of 500° C. for 45 minutes.

In one specific embodiment, the step of forming the porous conductive counter electrode layer on the porous supporting layer further includes steps of: forming a first material layer on the porous supporting layer, wherein the first material layer is selected from a group consisting of iron, cobalt, copper, silver, nickel, titanium, chromium, tin, magnesium, zinc, manganese, molybdenum, and aluminum; forming a second material layer on the first material layer, wherein the second material layer is selected from a group consisting of platinum, gold, copper, nickel, chromium, aluminum, and silver; or the second material layer is a transparent conductive film selected from a group consisting of indium-doped zinc oxide and aluminum-doped zinc oxide; or the second material layer is selected from a group consisting of titanium nitride and tantalum nitride; and performing a sintering process to oxidize the first material layer, and counter electrode forms a porous structure, wherein the sintering process has a sintering temperature ranging from 450 to 550° C. and a sintering time ranging from 25 to 50 minutes. In one embodiment, the sintering temperature is, for example, 460° C., 470° C., 480° C., 490° C., 500° C., 510° C., 520° C., 530° C., or 540° C. The sintering time is, for example, 27 minutes, 29 minutes, 30 minutes, 31 minutes, 33 minutes, 35 minutes, 37 minutes, 39 minutes, 41 minutes, 43 minutes, 45 minutes, 47 minutes, or 49 minutes. Refer to FIGS. 2A and 2B, FIG. 2A is a microscopic schematic diagram of a porous conductive counter electrode layer formed by performing a sintering process at a sintering temperature of 500° C. for 30 minutes, and FIG. 2B is a microscopic schematic diagram of a porous conductive counter electrode layer formed by performing a sintering process at a sintering temperature of 500° C. for 45 minutes. The porous conductive counter electrode layer has a sheet resistivity of 4.1 ohms/square unit (ohm/sq) and has a good porosity of 20 to 40% under the parameters of the sintering temperature of 500° C. with the sintering time of 30 minutes. Further, the porous conductive counter electrode layer has a sheet resistivity of 5.8 ohms/square unit (ohm/sq) and has a good porosity of 40 to 65% under the parameters of the sintering temperature of 500° C. and the sintering time of 45 minutes.

In a specific embodiment, the method 10 further includes steps of: coating a plurality of polystyrene microspheres that are dispersed on the porous supporting layer prior to the step of forming the first material layer on the porous supporting layer, thereby occupying a portion of a volume of the first material layer and a portion of a volume of the second material layer. It is noted that the polystyrene microspheres are mainly used as a template for the first material layer and the second material layer. More specifically, the polystyrene microspheres occupy the portion of the first material layer and the portion of the second material layer, and the polystyrene microspheres are removed so that a plurality of the pores are produced in both of the first material layer (or the carrier blocking layer) and the second material layer (or the conductive layer). In one embodiment, the polystyrene microspheres are melted and excluded at the same time during the sintering process. In another embodiment, the polystyrene microspheres may also be dissolved by chemical solution (e.g., toluene, acetone, chlorobenzene, or dichloromethane), or the polystyrene microspheres may be reacted to form a liquid and the liquid is excluded spontaneously. In another embodiment, the polystyrene microspheres may also be etched through plasma gas ions (e.g., oxygen ions, or argon ions).

In another specific embodiment, the step of forming the porous conductive counter electrode layer on the porous supporting layer further includes steps of: forming a first material layer on the porous supporting layer, wherein the first material layer is selected from a group consisting of iron, cobalt, copper, silver, nickel, titanium, chromium, tin, magnesium, zinc, manganese, molybdenum, and aluminum; forming a second material layer on the first material layer, wherein the second material layer is selected from a group consisting of platinum, gold, copper, nickel, chromium, aluminum, and silver; or the second material layer is a transparent conductive film selected from a group consisting of indium-doped zinc oxide and aluminum-doped zinc oxide; or the second material layer is selected from a group consisting of titanium nitride and tantalum nitride; performing a lithography and etching process on the first material layer and the second material layer such that each of the first material layer and the second material layer simultaneously has a porous structure; and performing a sintering process on the first material layer with the porous structure and the second material layer with the porous structure to oxidize the first material layer, and thus the oxidized first material layer and the second material layer become the carrier blocking layer and the conductive layer of the porous conductive counter electrode layer, respectively, wherein the sintering process has a sintering temperature ranging from 250 to 550° C. and a sintering time ranging from 25 to 95 minutes. In one embodiment, the sintering temperature is, for example, 260° C., 280° C., 300° C., 350° C., 400° C., 450° C., 500° C., 520° C., or 540° C. The sintering time is, for example, 30 minutes, 35 minutes, 40 minutes, 50 minutes, 60 minutes, 70 minutes, 80 minutes, 85 minutes, or 90 minutes. In one example, the lithography and etching process may be performed, for example, in a manner commonly-used in a semiconductor fabrication, and will not be described here.

In one embodiment, the method of forming the first material layer in the above step may be, for example, a thermal evaporation. In a specific example, nickel is deposited on the porous supporting layer at a deposition rate of 0.01 nm/sec to form the first material layer. In another embodiment, the method of forming the second material layer in the above step may be, for example, a thermal evaporation. In a specific example, gold is deposited on the first material layer at a deposition rate between 0.05 and 0.06 nm/sec to form the second material layer. It is noted that, in the case of using the above-mentioned nickel/gold material, nickel can form nickel oxide in the subsequent sintering process and the gold is embedded inside the nickel oxide to prevent direct contact between light absorber and gold. Further, an agglomeration effect is induced due to the fluidity in the sintering process, such that a network-shaped gold electrode is formed (as a counter electrode) after annealing process.

In a further specific embodiment, the step of forming the porous conductive counter electrode layer on the porous supporting layer further includes steps of: coating a plurality of composite metal microspheres on the porous supporting layer, wherein each of the composite metal microspheres has a core-shell structure comprising a core and a shell surrounding the core, wherein the core is selected from a group consisting of platinum, gold, copper, nickel, chromium, aluminum, and silver; or the core is a transparent conductive material selected from a group consisting of indium-doped zinc oxide and aluminum-doped zinc oxide; or the core is selected from a group consisting of titanium nitride and tantalum nitride; and wherein the shell is selected from a group consisting of iron, cobalt, copper, silver, nickel, titanium, chromium, tin, magnesium, zinc, manganese, molybdenum, and aluminum; and performing a sintering process on the composite metal microspheres to oxidize the shells of the composite metal microspheres, and thus the oxidized shell and the core (the core being conductive) become the carrier blocking layer and the conductive layer of the porous conductive counter electrode layer, respectively, wherein the sintering process has a sintering temperature ranging from 250 to 550° C. and a sintering time ranging from 25 to 95 minutes. In one embodiment, the sintering temperature is, for example, 260° C., 280° C., 300° C., 350° C., 400° C., 450° C., 500° C., 520° C., or 540° C. The sintering time is, for example, 30 minutes, 35 minutes, 40 minutes, 50 minutes, 60 minutes, 70 minutes, 80 minutes, 85 minutes, or 90 minutes.

It is noted that since the porous conductive counter electrode layer is formed by sintering, the porous conductive counter electrode layer has excellent adhesion with the underneath porous supporting layer. In addition, the first material layer is oxidized to form the carrier blocking layer substantially, and the second material layer substantially forms the conductive layer (as a counter electrode). Specifically, the carrier blocking layer is formed between the porous supporting layer and the conductive layer, so as to avoid a shunting path caused by the direct contact between the light absorbing material filled in the porous supporting layer and the conductive layer. It is also noted that the underneath carrier blocking layer may be a layered structure or an undulated layer to isolate the conductive layer and prevent the conductive layer from direct contacting with the light-absorbing material in the porous supporting layer.

In one embodiment, the porous conductive counter electrode layer further includes another carrier blocking layer, wherein the conductive layer is disposed (or inserted) between one carrier blocking layer and another carrier blocking layer. In other words, the porous conductive counter electrode layer is a sandwiched structure, such as a porous conductive counter electrode layer having "the carrier blocking layer (A)"–"the conductive layer (B)"–"the other carrier blocking layer (A)". In one specific example, the porous conductive counter electrode layer is, for example, a structure of "nickel oxide"–"nickel metal"–"nickel oxide", "metal oxide"–"transparent conductive oxide"–"metal oxide", "zinc oxide"–"indium-doped zinc oxide"–"zinc oxide", or "titanium oxide"–"indium-doped zinc oxide"–"titanium oxide".

Finally, the method 10 of fabricating the solar cell of one embodiment of the present disclosure has step 14: providing a light-absorbing material penetrating from the porous conductive counter electrode layer where the light-absorbing material fills in the porous supporting layer through a plurality of the pores of the porous conductive counter electrode layer. In step 14, the light-absorbing material is, for example, selected from a group consisting of a perovskite structural material and a photosensitive dye. In a specific example, the perovskite structure material is, for example, selected from a group consisting of $CH_3NH_3PbI_3$, $CH_3NH_3PbBr_3$, $CH(NH_2)_2PbI_3$, $CsPbI_3$. The photosensitive dye is, for example, N719, MK2, Z907 and others.

From the above, a method of fabricating a solar cell of the present disclosure is to use a porous conductive counter electrode layer as a counter electrode so as to provide an excellent conductivity. Further, the porous conductive counter electrode layer has an excellent adhesion to provide robust device architecture when reusing it. Furthermore, the porous conductive counter electrode layer includes a carrier blocking layer and a conductive layer. The carrier blocking layer can avoid a shunting path caused by direct contact between the light absorbing material filled in the porous supporting layer and the conductive layer.

It is to be noted that the numerical ranges (e.g., 10% to 15% of A) of the present disclosure include all upper and lower limits (i.e., 10%≤A≤15%) and all of the ranges of numerical points (e.g., 11, 12, 13, 14 . . . ). If the value range is not defined (for example, B being less than 0.2% or B being less than or identical to 0.2%), it means that the lower limit may be 0 (i.e., 0%≤B≤0.2%). The element combinations (C+D+E) refer to the total content of these n elements in parenthesis, but the content of some of the elements may be 0 (if the lower limit value contains 0, the total element content may also be 0). A proportion relationship of "weight percentages" of each ingredient may also be replaced by a proportion relationship of "part by weight".

The present disclosure has been described with a preferred embodiment thereof and it is understood that many changes and modifications to the described embodiment can be carried out without departing from the scope and the spirit of the disclosure that is intended to be limited only by the appended claims.

What is claimed is:

1. A method of fabricating a solar cell, comprising steps of:
   providing a transparent conductive substrate;
   forming a porous supporting layer on the transparent conductive substrate;
   forming a porous conductive counter electrode layer on the porous supporting layer, wherein the porous conductive counter electrode layer includes a carrier blocking layer and a conductive layer, and the carrier blocking layer is deposited between the porous supporting layer and the conductive layer, wherein the step of forming the porous conductive counter electrode layer on the porous supporting layer further comprises steps of:
      forming a first material layer on the porous supporting layer, wherein the first material layer is selected from a group consisting of iron, cobalt, copper, silver, nickel, titanium, chromium, tin, magnesium, zinc, manganese, molybdenum, and aluminum;
      forming a second material layer on the first material layer, wherein the second material layer is selected from a group consisting of platinum, gold, copper, nickel, chromium, aluminum, and silver; or the second material layer is a transparent conductive film selected from a group consisting of indium-doped zinc oxide and aluminum-doped zinc oxide; or the second material layer is selected from a group consisting of titanium nitride and tantalum nitride; and
      performing a sintering process on the first material layer and the second material layer to oxidize the first material layer, wherein the sintering process has a sintering temperature ranging from 450 to 550° C. and a sintering time ranging from 25 to 50 minutes; and
   providing light-absorbing material to penetrate through the porous conductive counter electrode layer wherein the light-absorbing material are filled into the porous supporting layer through a plurality of pores of the porous conductive counter electrode layer.

2. The method of fabricating the solar cell according to claim 1, wherein the carrier blocking layer is selected from a group consisting of iron oxide, cobalt oxide, copper oxide, silver oxide, nickel oxide, titanium oxide, chromium oxide, tin oxide, magnesium oxide, zinc oxide, manganese oxide, molybdenum oxide, and aluminum oxide.

3. The method of fabricating the solar cell according to claim 1, wherein the conductive layer is selected from a group consisting of platinum, gold, copper, nickel, chromium, aluminum, and silver; or the conductive layer is a transparent conductive film selected from a group consisting of indium-doped zinc oxide and aluminum-doped zinc oxide; or the conductive layer is selected from a group consisting of titanium nitride and tantalum nitride.

4. The method of fabricating the solar cell according to claim 1, wherein the porous supporting layer is selected from a group consisting of titanium oxide, zinc oxide, tin oxide, nickel oxide, copper oxide, aluminum oxide, and zirconium oxide.

5. The method of fabricating the solar cell according to claim 1, further comprising steps of: coating a plurality of polystyrene microspheres on the porous supporting layer prior to the step of forming the first material layer on the porous supporting layer, wherein the plurality of polystyrene microspheres occupy a portion of a volume of the first material layer and a portion of a volume of the second material layer.

6. The method of fabricating the solar cell according to claim 5, further comprising steps of: removing the polystyrene microspheres after the step of forming the porous conductive counter electrode layer.

7. The method of fabricating the solar cell according to claim 1, wherein the step of forming the porous conductive counter electrode layer on the porous supporting layer, after the step of forming a second material layer on the first material layer, further comprises a step of:
   performing a lithography and etching process on the first material layer and the second material layer such that each of the first material layer and the second material layer has a porous structure,
   wherein the sintering process has a sintering temperature ranging from 250 to 350° C. and a sintering time ranging from 25 to 35 minutes.

8. The method of fabricating the solar cell according to claim 1, wherein the light-absorbing material is selected from a group consisting of a perovskite structure material, semiconductor compounds, and photosensitive dyes.

9. The method of fabricating the solar cell according to claim 1, wherein in the step of forming the porous conductive counter electrode layer on the porous supporting layer, the porous conductive counter electrode layer further comprises another carrier blocking layer, wherein the conductive layer is disposed between the carrier blocking layer and the another carrier blocking layer.

10. The method of fabricating the solar cell claim 1, comprising steps of:
    providing a transparent conductive substrate;
    forming a porous supporting layer on the transparent conductive substrate;
    forming a porous conductive counter electrode layer on the porous supporting layer, wherein the porous conductive counter electrode layer includes a carrier blocking layer and a conductive layer, and the carrier blocking layer is deposited between the porous supporting layer and the conductive layer, wherein the step of forming the porous conductive counter electrode layer on the porous supporting layer further comprises steps of:
       coating a plurality of composite metal microspheres on the porous supporting layer, wherein each of the composite metal microspheres has a core-shell structure comprising a core and a shell surrounding core, wherein the core is selected from a group consisting of platinum, gold, copper, nickel, chromium, aluminum, and silver; or the core is a transparent conductive material selected from a group consisting of indium-doped zinc oxide and aluminum-doped zinc oxide; or the core is selected from a group consisting of titanium nitride and tantalum nitride; and wherein the shell is selected from a group consisting of iron, cobalt, copper, silver, nickel, titanium, chromium, tin, magnesium, zinc, manganese, molybdenum, and aluminum; and performing a sintering process on the composite metal microspheres to oxidize the shells of the composite metal microspheres, and thus the oxidized shell and the core become the carrier blocking layer and the conductive layer of the porous conductive counter electrode layer, respectively, wherein the sintering process has a sintering temperature ranging from 250 to 550° C. and a sintering time ranging from 25 to 95 minutes; and providing light-absorbing material to penetrate through the porous conductive counter electrode layer wherein the light-absorbing material are filled into the porous supporting layer through a plurality of pores of the porous conductive counter electrode layer.

* * * * *